US010121702B1

(12) United States Patent
Park et al.

(10) Patent No.: US 10,121,702 B1
(45) Date of Patent: Nov. 6, 2018

(54) METHODS, APPARATUS AND SYSTEM FOR FORMING SOURCE/DRAIN CONTACTS USING EARLY TRENCH SILICIDE CUT

(71) Applicant: GLOBALFOUNDRIES INC., Grand Cayman (KY)

(72) Inventors: Chanro Park, Clifton Park, NY (US); Min Gyu Sung, Latham, NY (US); Ruilong Xie, Niskayuna, NY (US); Puneet H. Suvarna, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/638,087

(22) Filed: Jun. 29, 2017

(51) Int. Cl.
| | |
|---|---|
| *H01L 21/768* | (2006.01) |
| *H01L 29/66* | (2006.01) |
| *H01L 21/8234* | (2006.01) |
| *H01L 27/088* | (2006.01) |
| *H01L 29/08* | (2006.01) |
| *H01L 23/535* | (2006.01) |

(52) U.S. Cl.
CPC .. *H01L 21/76897* (2013.01); *H01L 21/76805* (2013.01); *H01L 21/823418* (2013.01); *H01L 21/823431* (2013.01); *H01L 21/823475* (2013.01); *H01L 23/535* (2013.01); *H01L 27/0886* (2013.01); *H01L 29/0847* (2013.01); *H01L 29/66545* (2013.01)

(58) Field of Classification Search
CPC ............. H01L 21/76897; H01L 23/535; H01L 29/0847; H01L 27/0886; H01L 21/823475; H01L 21/823431; H01L 21/76805; H01L 29/66545; H01L 21/823418
USPC ........................................................ 257/382
See application file for complete search history.

(56) References Cited

U.S. PATENT DOCUMENTS

2015/0187945 A1* 7/2015 Kamineni ............. H01L 29/785
257/384
2016/0268257 A1* 9/2016 Lim .................... H01L 27/0886

* cited by examiner

*Primary Examiner* — Fernando L Toledo
*Assistant Examiner* — Adam S Bowen
(74) *Attorney, Agent, or Firm* — Williams Morgan, P.C.

(57) ABSTRACT

At least one method, apparatus and system disclosed herein involves performing an early-process of source/drain (S/D) contact cut and S/D contact etch steps for manufacturing a finFET device. A gate structure, a source structure, and a drain structure of a transistor are formed. The gate structure comprises a dummy gate region, a gate spacer, and a liner. A source/drain (S/D) contact cut process is performed. An S/D contact etch process is performed. A replacement metal gate (RMG) process is performed subsequent to performing the S/D contact etch process. An S/D contact metallization process is performed.

20 Claims, 16 Drawing Sheets

METHODS, APPARATUS AND SYSTEM FOR FORMING SOURCE/DRAIN CONTACTS USING EARLY TRENCH SILICIDE CUT

BACKGROUND OF THE INVENTION

Field of the Invention

Generally, the present disclosure relates to the manufacture of sophisticated semiconductor devices, and more specifically, to various methods for forming source/drain contacts using early trench silicide (TS) cut in finFET devices.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain. This is sometimes referred to as a so-called short channel effect, wherein the characteristic of the FET as an active switch is degraded.

In contrast to a planar FET, which has a planar structure, there are so-called 3D devices, such as an illustrative finFET device, which is a 3-dimensional structure. More specifically, in a finFET, a generally vertically positioned, fin-shaped active area is formed and a gate electrode encloses both of the sides and the upper surface of the fin-shaped active area to form a trigate structure so as to use a channel having a 3-dimensional structure instead of a planar structure. In some cases, an insulating cap layer, e.g., silicon nitride, is positioned at the top of the fin and the finFET device only has a dual-gate structure.

FinFET designs use "fins" that may be formed on the surface of a semiconductor wafer using selective-etching processes. The fins may be used to form a raised channel between the gate and the source and drain of a transistor. The gate is then deposited such that it wraps around the fin to form a trigate structure. Since the channel is extremely thin, the gate would generally have a greater control over the carriers within. However, when the transistor is switched on, the shape of the channel may limit the current flow. Therefore, multiple fins may be used in parallel to provide greater current flow for increased drive strength.

FIG. 1 illustrates a stylized cross-sectional depiction of a state-of-the-art finFET device. A finFET device 100 illustrated in FIG. 1 comprises a plurality of "fins" 110. The semiconductor device may be position to a vertical orientation, creating one or more fins 110. The source and drain of the finFET are placed horizontally along the fin. A high-k metal gate 120 wraps over the fin, covering it on three sides. The gate 120 defines the length of the finFET device. The current flow occurs along an orthogonal crystal plane in a direction parallel to the plane of the semiconductor wafer. The electrically significant height of the fin (labeled H) is typically determined by the amount of oxide recess in the fin reveal step and hence is constant for all fins 110.

The thickness of the fin (labeled $T_{fi}$) determines the short channel behavior of the transistor device and is usually small in comparison with the height H of the fin 110. The pitch (labeled P) of the fins is determined by lithographic constraints and dictates the wafer area to implement the desired device width. A small value of the pitch P and a large value of the height H enable a better packing of the devices per square area resulting in a denser design, or more efficient use of silicon wafer area.

The scaling down of integrated circuits coupled with higher performance requirements for these circuits have prompted an increased interest in finFETs. As critical dimensions get smaller, an increased risk of shorting between gate regions and source/drain (S/D) contacts may occur. Using state-of-the-art trench silicide (TS) etching processes, excessive corner erosion of gate metal regions may occur, resulting in shorting between gate regions and S/D contacts may occur. FIG. 2 illustrates a stylized depiction of a gate region experiencing excess corner erosion as a result of state-of-the-art TS contact etch processes. Generally, the term TS contact etch process refers to S/D contact etching process, and TS contact generally refers to S/D contacts.

FIG. 2 illustrates an integrated circuit 200 that comprises a substrate 210 on which an intermediate layer 220 is formed. The intermediate layer 220 may be a silicon oxide layer placed in-between fins, or the intermediate layer 220 may be a channel material placed in-between SiO2 depending on cross-sectional plane. FIG. 2 also shows a plurality of gate formations 250. The gate formations 250 may be surrounded by silicon oxide. Each of the gate formations 250 comprises a SiN liner 230, a SiN capping layer 240, and a gate spacer 225 that encompasses a gate metal region 255.

When forming the integrated circuit 200, the state-of-the-art calls for a TS contact etch process to be performed after forming the gate region 250 shown in FIG. 2. As a result, the TS etching process may result in excessive corner erosion during TS contact etching, as illuminated by the circles labeled 280. This excessive corner erosion may cause shorting between gate regions 250 and S/D regions, resulting in device operation problems.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for performing an early-process of source/drain (S/D) contact cut and S/D contact etch steps for manufacturing a finFET device. A gate structure, a source structure, and a drain structure of a transistor are formed. The gate structure comprises a dummy gate region, a gate spacer, and a liner. A source/drain (S/D) contact cut process is performed. An S/D contact etch process is performed. A replacement metal gate (RMG) process is performed subsequent to performing the S/D contact etch process. An S/D contact metallization process is performed.

BRIEF DESCRIPTION OF THE DRAWINGS

The disclosure may be understood by reference to the following description taken in conjunction with the accompanying drawings, in which like reference numerals identify like elements, and in which.

Figure 1:
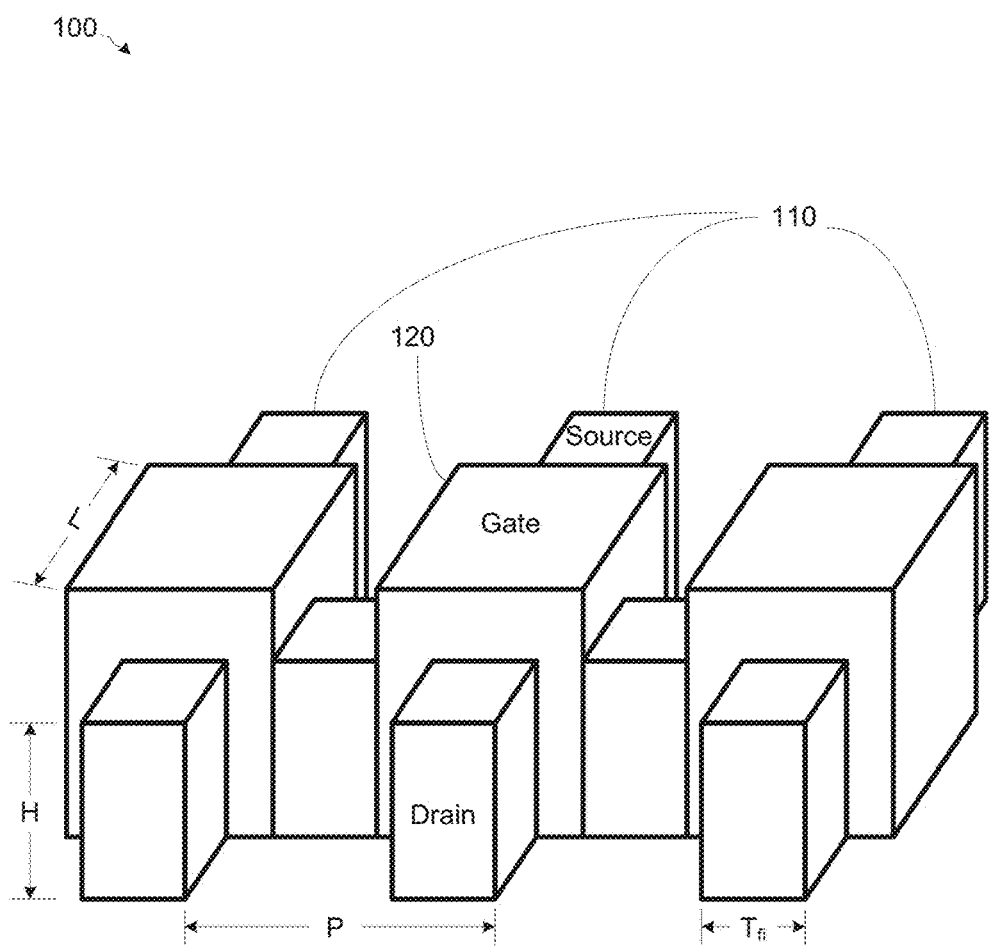
FIG. 1 illustrates a stylized cross-sectional depiction of a state-of-the-art finFET device.
Figure 2:
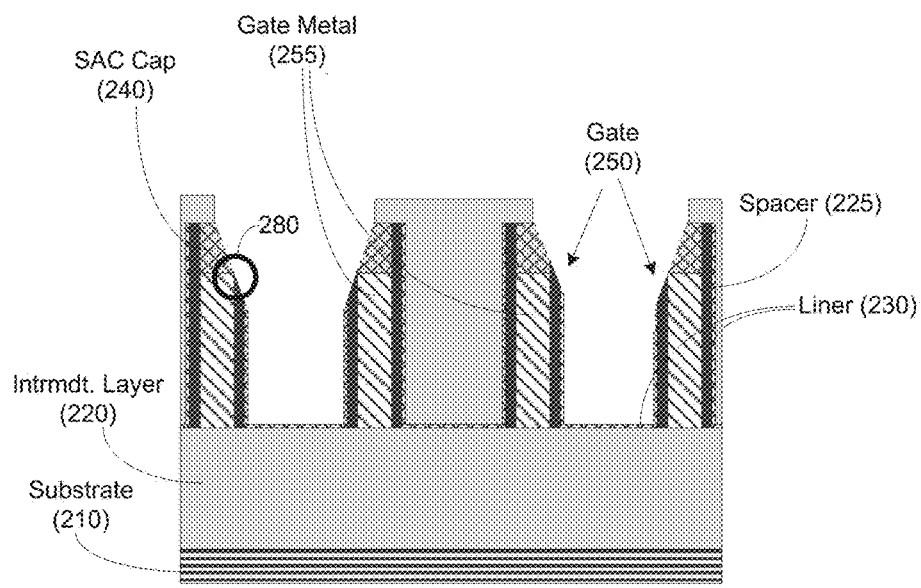
FIG. 2 illustrates a stylized depiction of an integrated circuit that comprises a substrate on which an intermediate layer is formed.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached Figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for performing one or more process operations to form trench silicide (TS) features prior to performing various processes that are traditionally performed before engaging in cut-processes for forming TS features. The process operations to form TS features may include TS cut lithography (sometimes referred to as non-TS-cut lithography), and TS cut reactive-ion etching (RIE) (sometimes referred to as non-TS RIE) processes. For example, in some embodiments herein, a TS cut lithography process and a TS cut RIE process may be performed prior to performing a poly-open CMP (POC) process, replacement metal gate (RMG) process, self-aligned cap (SAC) deposition process, and/or a SAC CMP process. This process-flow implementation may provide for a more simple manufacturing process since a litho-stack (e.g., organic under-layer (ODL), spin-on hardmask (SOH)) may be used as a sacrificial layer, which may result in the need for one less CMP process compared to traditional process flows. The term "TS cut" may refer to a location in which TS features and not formed.

Figure 3:
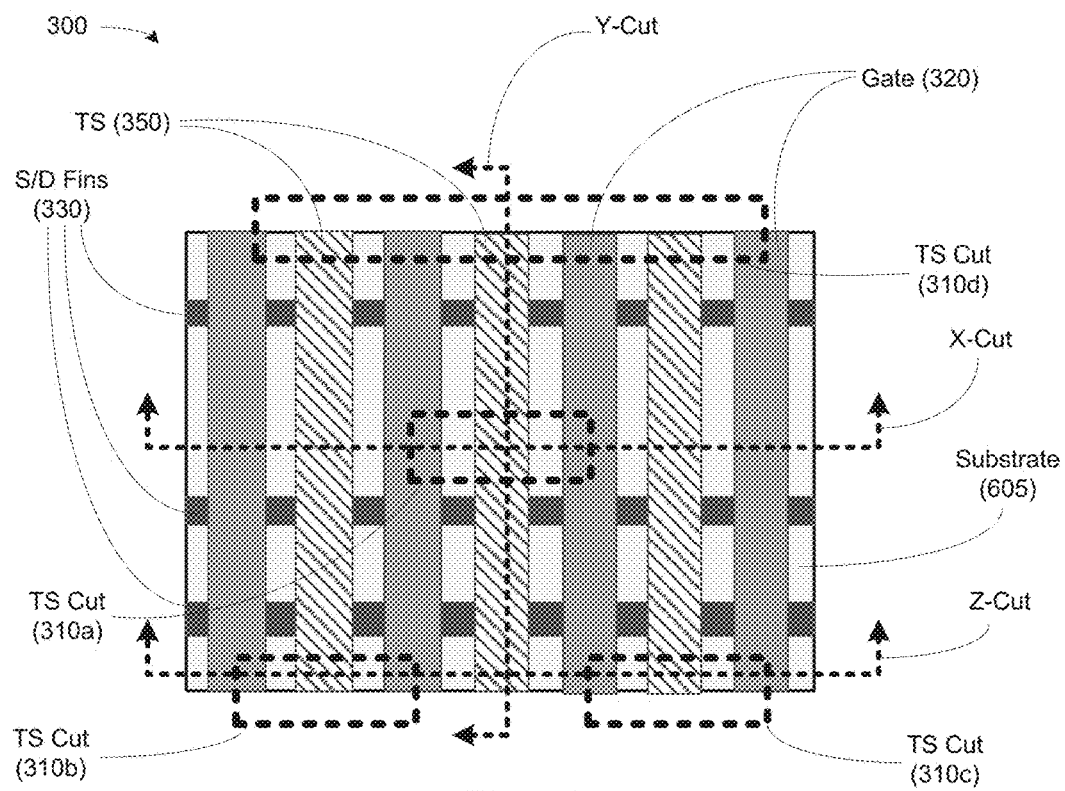
FIGS. 3 illustrates a stylized, simplified top view of a finFET device, in accordance with embodiments herein.

Turning now to FIG. 3, a stylized, simplified top view of a finFET device, in accordance with embodiments herein, is illustrated. FIG. 3 illustrates an integrated circuit device 300 comprising a plurality of fins 330 formed on a substrate 305. Further, FIG. 3 illustrates a plurality of gates formations 320. Adjacent the gates formations 320 are a plurality of TS features 350.

FIG. 3 also shows an X-cut line, a Y-cut line, and a Z-cut line. These cut-lines are provided for reference with respect to various cross-sectional views shown in subsequent figures. FIG. 3 also shows TS cut lines 310a, 310b, 310c, 310d, wherein the TS features 350 that are not within the TS cut lines 310a-310d areas eventually become source/drain contacts. In embodiments herein, the TS cut process may be performed relatively early in the process flow, subsequent to forming the gate features 320 and the fins 330.

With regard to the X-cut, Y-cut, and Z-cut lines of FIG. 3, FIGS. 4A-14A represent stylized cross-sectional views of finFET devices with respect to the X-cut line. FIGS. 4B-14B represent stylized cross-sectional views of finFET devices with respect to the Y-cut line. Further, FIG. 9C represents a stylized cross-sectional view of finFET devices with respect to the Z-cut line, in accordance with embodiments herein.

Figure 4A:
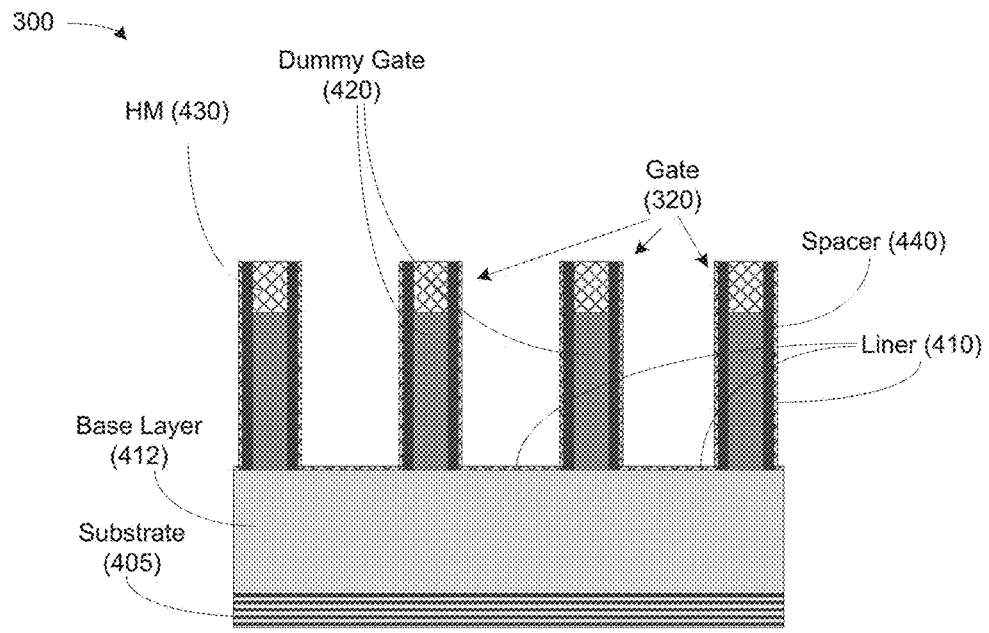
FIG. 4A illustrates a stylized cross-sectional view of the finFETs of FIG. 3 (along the X-cut line), illustrating a plurality of gate formations in accordance with embodiments herein.

Turning now to FIG. 4A, a stylized cross-sectional view of the finFETs of FIG. 3 (along the X-cut line), illustrating a plurality of gate formations in accordance with embodiments herein, is provided. The integrated circuit device 300 is formed, wherein a plurality of gate formations (PC) 320 may be formed on a base layer 412 (e.g., local shallow trench isolation (LSTI) $SiO_2$ or channel material depending on cross-sectional plane), which may be formed over a substrate layer 405 (e.g., Si).

Each of the gate formations 320 may comprise a dummy gate 420, which may be comprised of a poly-silicon material. The gate formations 320 may be encompassed by a spacer 440, which may be comprised of SiN, SiOC, SiOCN, SiBCN, etc. A PC hard mask (HM) 430 may be formed over each of the dummy gates 420. In some embodiments, the PC HM 430 may be comprised of SiN. The PC HM 430 provides protection for the dummy gates 420 during various processing, include TS cut processes.

Those skilled in the art having benefit of the present disclosure would appreciate that if the X-cut line of FIG. 3 were placed over the fin 330, the cross-sectional view would show a channel material between the fins 330.

Figure 4B:
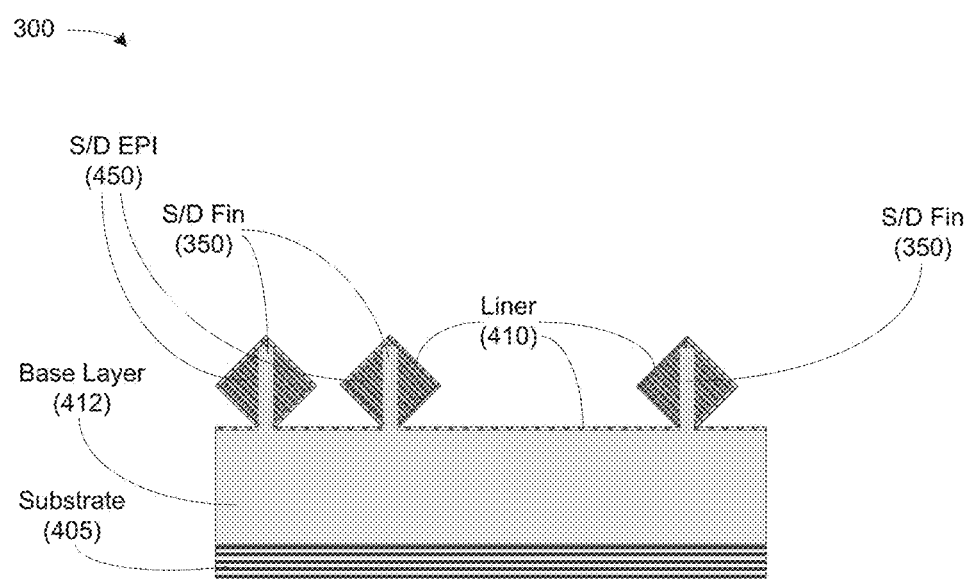
FIG. 4B illustrates a stylized cross-sectional view of the finFETs of FIG. 3 (along the Y-cut line), illustrating a plurality of fins in accordance with embodiments herein.

Turning now to FIG. 4B, a stylized cross-sectional view of the finFETs of FIG. 3 (along the Y-cut line), illustrating a plurality of fins in accordance with embodiments herein, is provided. A plurality of fins 330 are formed over the substrate 405, encompassed by the base layer 412. Further, an epitaxial feature 450 may be formed on the top portions of each of the fins 330. The liner 410 may be formed over the EPI features 450, as well as atop the base layer 412.

Those skilled in the art having benefit of the present disclosure would appreciate that a plurality of process steps are performed in order to form EPI features 450. In some embodiments, the EPI features 450 may be grown to a size in the range of about 5 nm to about 20 nm (lateral EPI width). The EPI features 450 may be deposited using an ultra-high vacuum chemical vapor deposition process (CVD) process (UHVCVD). The precursors for the EPI features 450 may comprise gases comprising silicon (e.g., $SiH_4$, $Si_2H_4Cl_2$, $Si_2H_6$, $Si_3H_8$) and/or gases comprising germanium (e.g., $GeH_4$). The partial pressures of these gases may be varied to adjust the atomic ratio of germanium to silicon. In one embodiment, the EPI features 450 may be grown at a temperature of 700° C., and the temperature may be decreased to 550° C. with source gas.

Figure 5A:
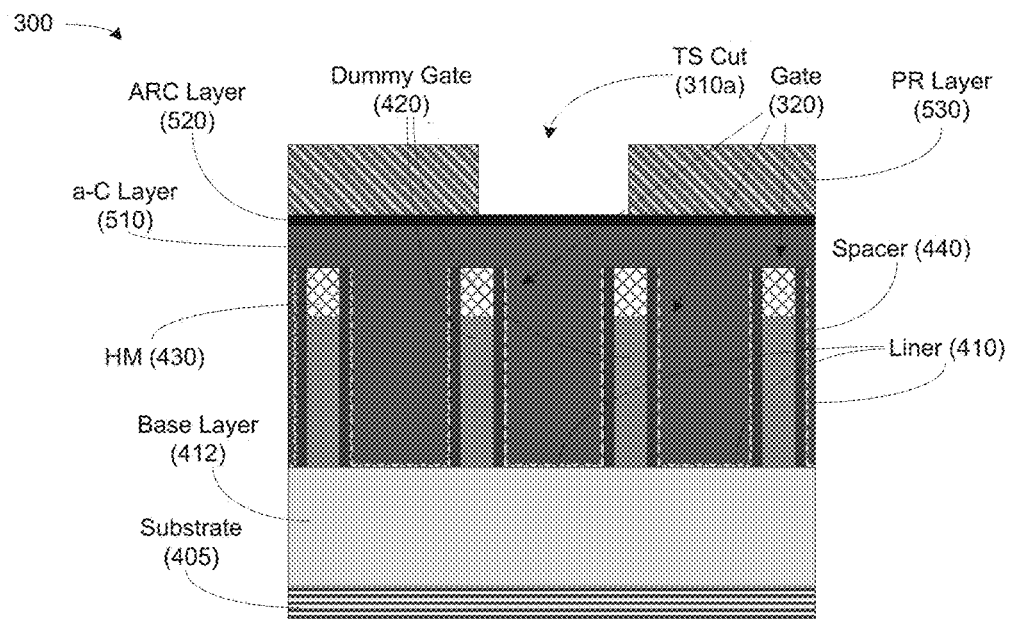
FIG. 5A illustrates a stylized cross-sectional view of the finFETs of FIG. 3 (along the X-cut line), illustrating a formation of a lithostack, in accordance with embodiments herein.

Turning now to FIG. 5A, a stylized cross-sectional view of the finFETs of FIG. 3 (along the X-cut line), illustrating a formation of a lithostack, in accordance with embodiments herein, is provided. FIG. 5A shows an amorphous-Carbon (a-C) layer 510 formed above the liner 510 and in between the gate features 320. An a-C deposition process is performed for depositing the a-C layer 510. The a-C layer 510 may be comprised of one or more of several dielectric materials, such as a silicon oxide layer.

The a-C layer 510 may comprised of an organic underlayer (ODL) or alternatively, a spin-on hardmask (SOH)) layer. The ODL, SOH layers may be used as sacrificial layer(s), which may result in the need for one less CMP process as compared to traditional process flows. As shown in FIGS. 5A, the a-C layer 510 is formed above the base layer 412 and the S/D formations 320. The a-C layer 510 also encompasses the PC formations 310.

Moreover, an anti-reflective coat (ARC) layer 520 may be formed over the a-C layer 510. The ARC layer 520 may be comprised of $SiO_2$, SiON, or the like. Further, a photoresist (PR) layer 530 may be formed on the layer 520. FIG. 5A shows a break in the PR layer 530 that represents the TS cut 310 areas.

Figure 5B:
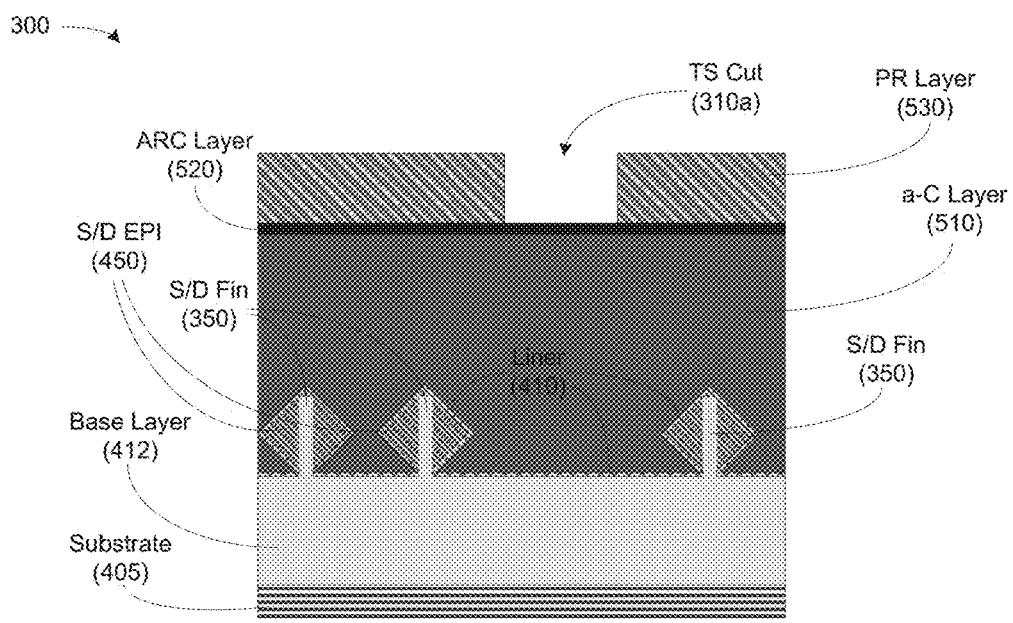
FIG. 5B illustrates a stylized cross-sectional view of the finFETs of FIG. 3 (along the Y-cut line), illustrating a formation of a lithostack, in accordance with embodiments herein.

Turning now to FIG. 5B, a stylized cross-sectional view of the finFETs of FIG. 3 (along the Y-cut line), illustrating a formation of a lithostack, in accordance with embodiments herein, is provided. As shown in FIGS. 5B, the a-C layer 410 is formed above S/D formations 330, and encompasses the PC formations 320. FIG. 5B also shows the layer 510 and the PR layer 530. FIG. 5B also shows a break in the PR layer 530, which occurs in the TS, cut 310 region areas.

Figure 6A:
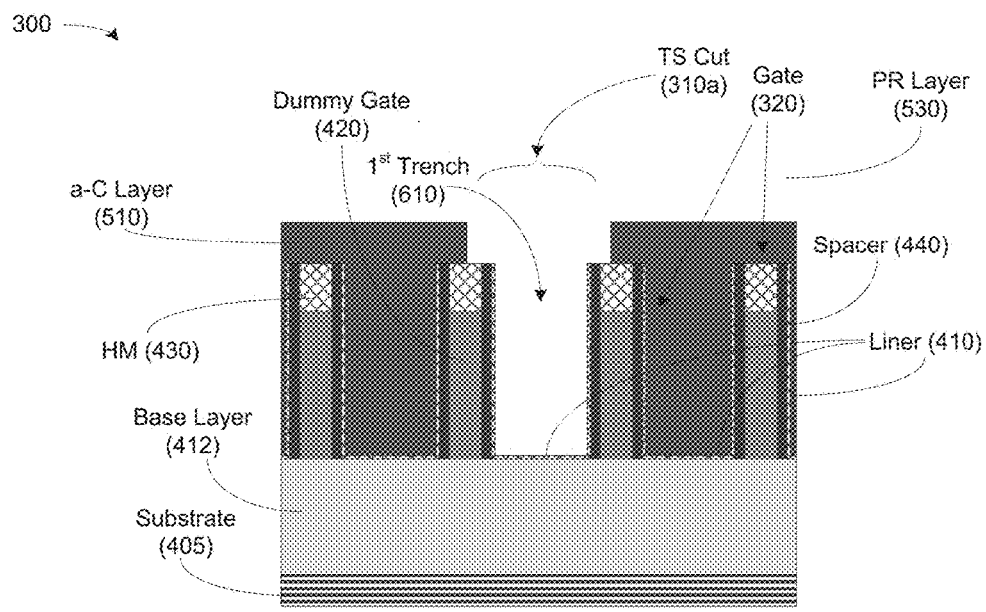
FIG. 6A illustrates a stylized cross-sectional view of the finFETs of FIG. 3 (along the X-cut line), illustrating an aftermath of a TS cut RIE process, in accordance with embodiments herein.
Figure 6B:
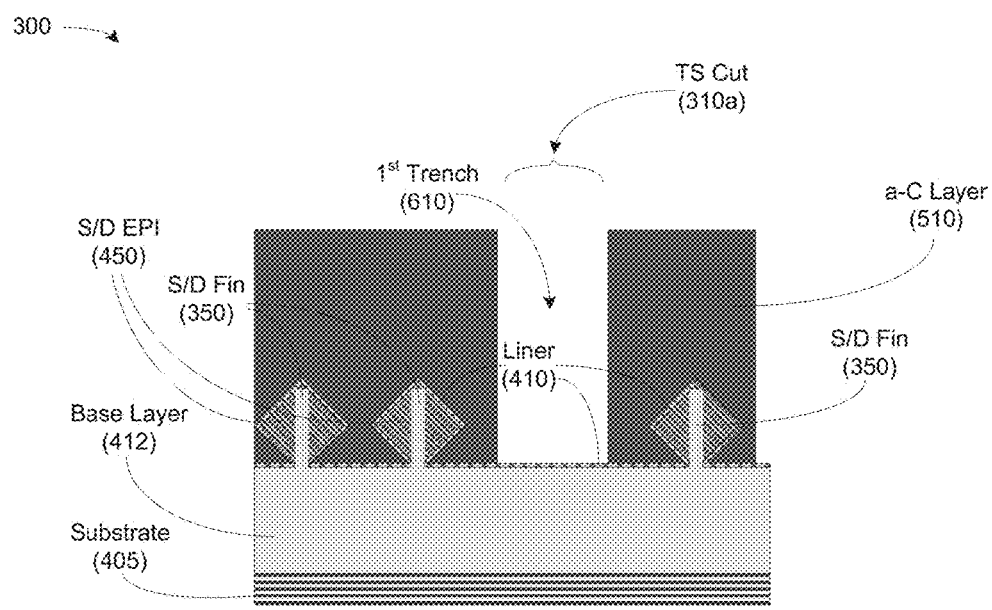
FIG. 6B illustrates a stylized cross-sectional view of the finFETs of FIG. 3 (along the Y-cut line), illustrating the aftermath of the TS cut RIE process, in accordance with embodiments herein.

Turning now to FIG. 6A, a stylized cross-sectional view of the finFETs of FIG. 3 (along the X-cut line), illustrating an aftermath of a TS cut RIE process, in accordance with embodiments herein, is provided. FIG. 6B provides a stylized cross-sectional view of the finFETs of FIG. 3 (along the Y-cut line), illustrating the aftermath of the TS cut RIE process, in accordance with embodiments herein. Referring simultaneously to FIGS. 6A and 6B, a reactive-ion etch (RIE) process is performed in the TS cut region 310a (FIG. 3) to remove a portion of the lithostack layer 510 for forming a TS contact feature. The portion of the layer 510 that is not protected by the ARC layer 520 and the PR layer 530 is removed by the RIE process. Since the area under the TS cut 310a is not protected by the ARC layer 520 and the PR layer 530, a first trench 610 is formed. Those skilled in the art having benefit of the present disclosure would appreciate that other trenches similar to the first trench 610 are formed in areas of the other TS cut regions 310b-d.

Upon performing the RIE process, the ARC layer 520 and the PR layer 530 is removed, along with a portion of the a-C layer 510 in the TS cut region 310a. This portion of the a-C layer 510 may be removed down to the liner 410. FIG. 6B shows a side-view cross-section, illustrating that the portion of the a-C layer 510 under the TS cut region 310a is removed down to the liner 410. Thus, the RIE process results in a trench region in the TS cut region 310a. Generally, non-TS a-C etching is easier to perform, and further, the critical dimension control for this process is generally easier, thereby providing further advantages in implementing embodiments herein.

Figure 7A:
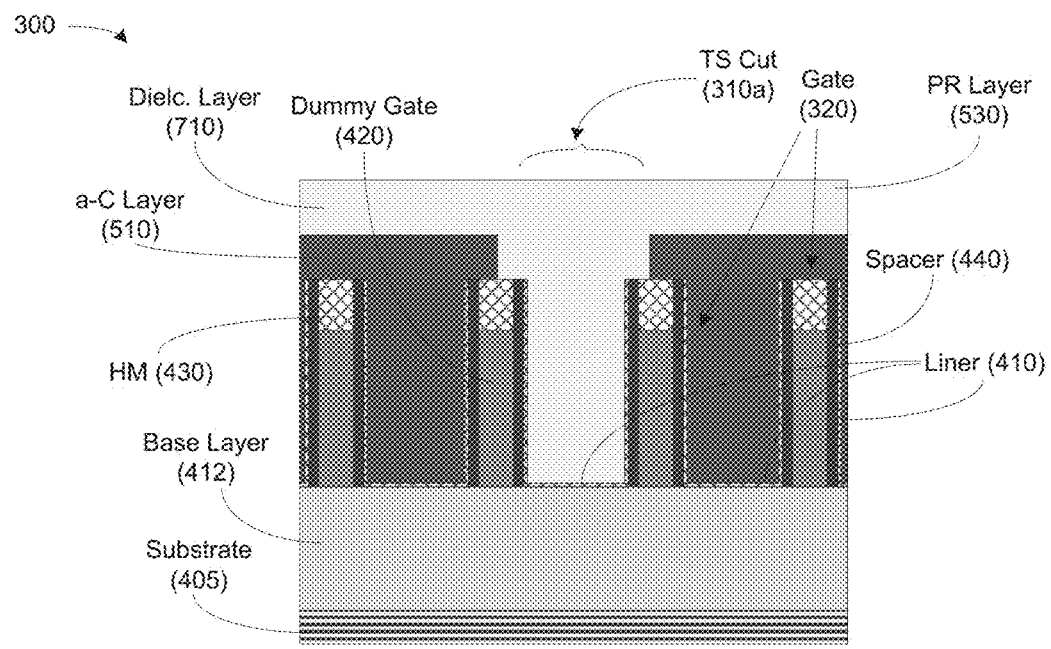
FIG. 7A illustrates a stylized cross-sectional view of the finFETs of FIG. 3 (along the X-cut line), illustrating a dielectric material deposition process, in accordance with embodiments herein.
Figure 7B:
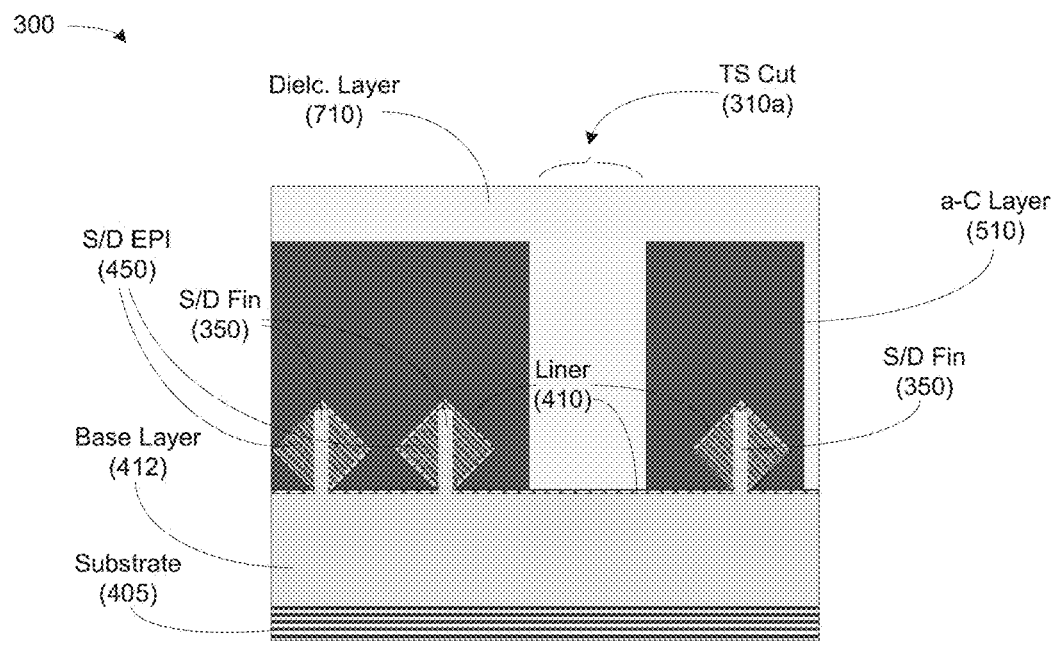
FIG. 7B illustrates a stylized cross-sectional view of the finFETs of FIG. 3 (along the Y-cut line), illustrating the aftermath of the dielectric material deposition process, in accordance with embodiments herein.

Turning now to FIG. 7A, a stylized cross-sectional view of the finFETs of FIG. 3 (along the X-cut line), illustrating a dielectric material deposition process, in accordance with embodiments herein, is provided. FIG. 7B provides a stylized cross-sectional view of the finFETs of FIG. 3 (along the Y-cut line), illustrating the aftermath of the dielectric material deposition process, in accordance with embodiments herein. Referring simultaneously to FIGS. 7A and 7B, a dielectric material deposition process may be performed for depositing a dielectric material 710 within the TS cut region 310a. That is, the deposition process deposits the dielectric material 710 into the trench region formed by the RIE process in the TS cut region 310a. In embodiment, an atomic layer deposition (ALD) process may be performed to deposit the dielectric material 710.

In some cases, the cut provided by the RIE process (FIG. 6A, 6B) forms a cut region to separate fin features and gate features formation of silicide contacts (i.e., trench silicide or TS). The cut region may be referred to as a silicide cut region or a TS cut region. Using the ALD process, the cut region is filled with the dielectric material 710, which is generally selectively etchable. In some embodiments, the dielectric material 710 may be SiN, SiOCN, SiBCN, or SiCO layer.

Figure 8A:
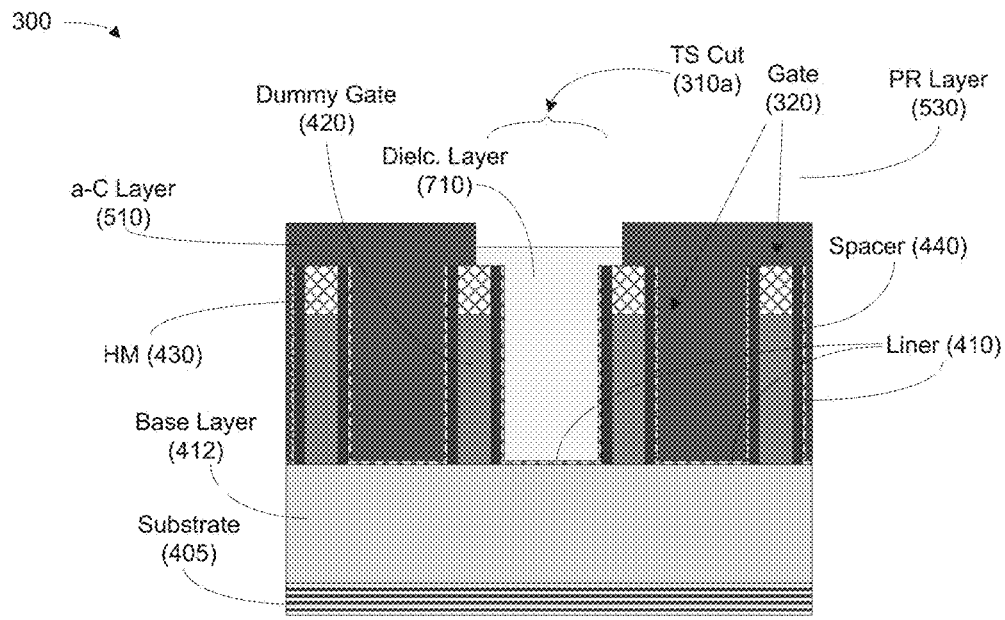
FIG. 8A illustrates a stylized cross-sectional view of the finFETs of FIG. 3 (along the X-cut line), illustrating an aftermath of an etchback process, in accordance with embodiments herein.
Figure 8B:
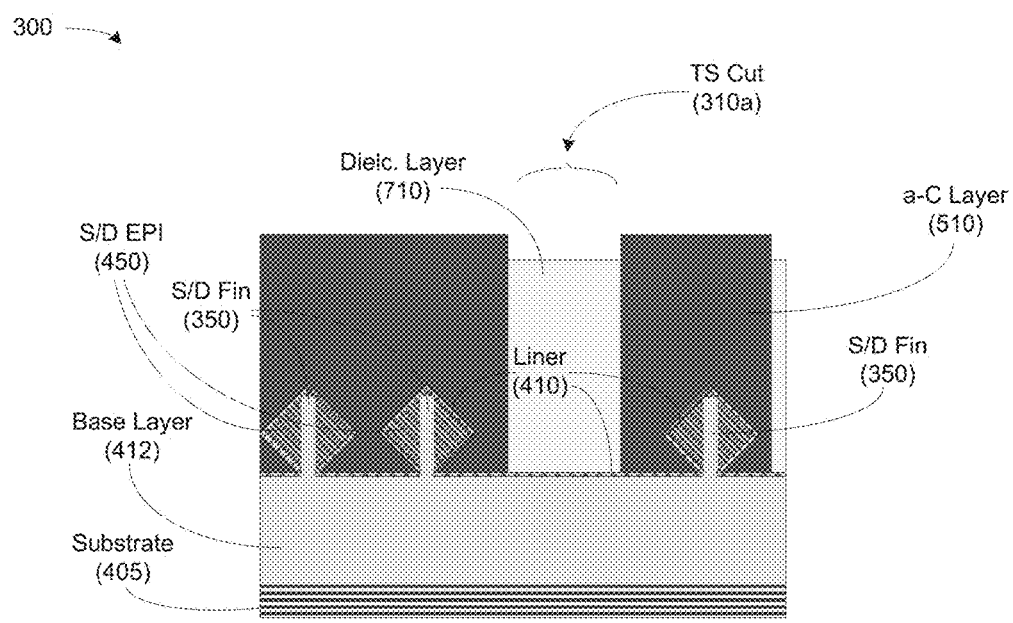
FIG. 8B illustrates a stylized cross-sectional view of the finFETs of FIG. 3 (along the Y-cut line), illustrating the aftermath of the etchback process, in accordance with embodiments herein.

Turning now to FIG. 8A, a stylized cross-sectional view of the finFETs of FIG. 3 (along the X-cut line), illustrating an aftermath of an etchback process, in accordance with embodiments herein, is provided. FIG. 8B provides a stylized cross-sectional view of the finFETs of FIG. 3 (along the Y-cut line), illustrating the aftermath of the etchback process, in accordance with embodiments herein. Referring simultaneously to FIGS. 8A and 8B, an etchback process may be performed to selectively etch back the dielectric material 710 in the manner exemplified. Therefore, the etchback process removes a portion of the dielectric material 710 from above the gate formations 320 and the a-C layer 510. Further, the etchback process reduces the level of the dielectric material 710 to be within the TS cut region 310a-d, as shown in FIGS. 8A and 8B.

Figure 9A:
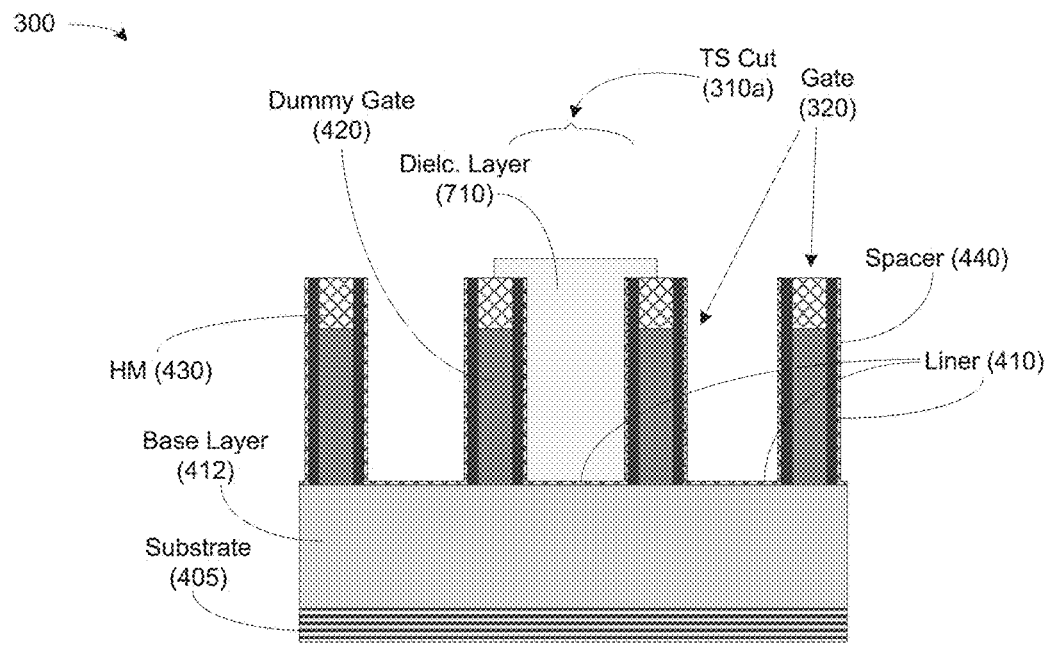
FIG. 9A illustrates a stylized cross-sectional view of the finFETs of FIG. 3 (along the X-cut line), illustrating an aftermath of an etchback process, in accordance with embodiments herein.
Figure 9B:
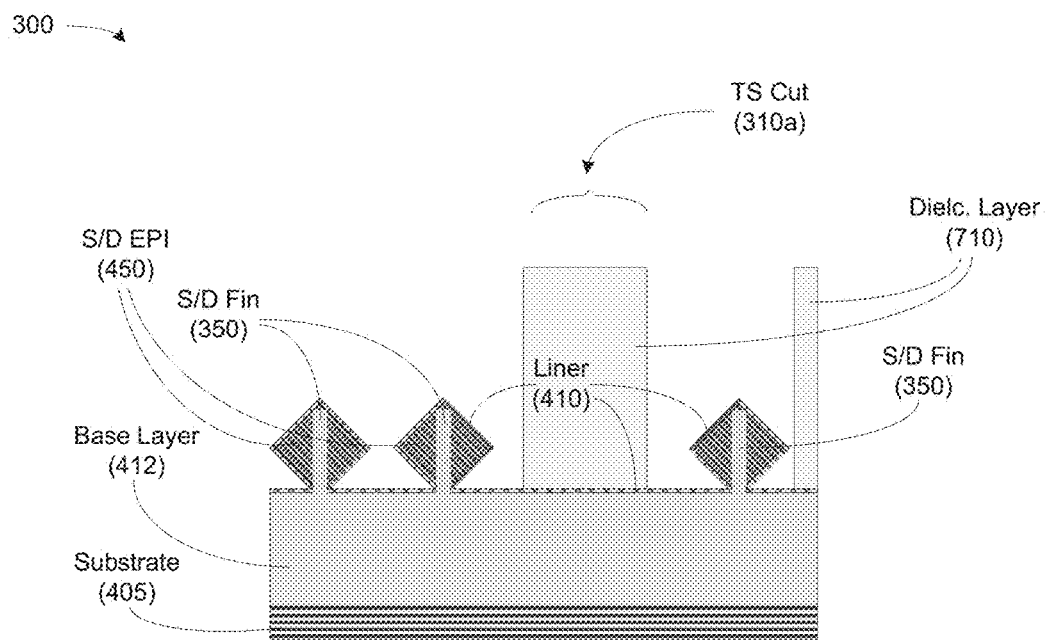
FIG. 9B illustrates a stylized cross-sectional view of the finFETs of FIG. 3 (along the Y-cut line) regarding the a-C ashing process, in accordance with embodiments herein.
Figure 9C:
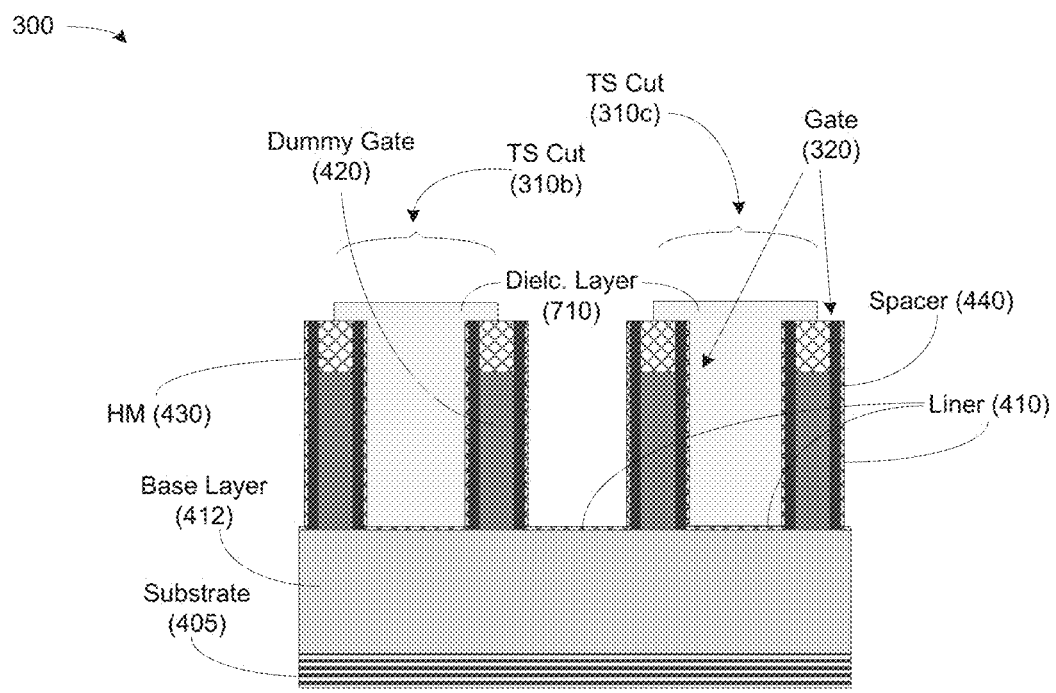
FIG. 9C illustrates a stylized cross-sectional view of finFET devices with respect to the Z-cut line, in accordance with embodiments herein.

Turning now to FIG. 9A, a stylized cross-sectional view of the finFETs of FIG. 3 (along the X-cut line), illustrating an aftermath of an etchback process, in accordance with embodiments herein, is provided. FIG. 9B provides a stylized cross-sectional view of the finFETs of FIG. 3 (along the Y-cut line) regarding the a-C ashing process, in accordance with embodiments herein. Referring simultaneously to FIGS. 9A and 9B, an a-C ashing process may be performed to remove a portion of the a-C layer 510. The a-C ashing process may refer to a dry etching process.

As shown in FIG. 9A, upon removing the a-C layer 510, the remaining portion of the dielectric material 710 between the gates 320 that are not beneath the TS cut region 310a are shown. As shown in FIG. 9B, the remaining portion of the dielectric material 710 between the fins 330 that are not beneath the TS cut region 310a are shown.

Further, for multiple patterning processing of the device 300, a memorization scheme may be implemented. For example, FIG. 9C provides a stylized cross-sectional view of the finFETs of FIG. 3 (along the Z-cut line), in accordance with embodiments herein. Those skilled in the art having benefit of the present disclosure would appreciate that processes similar to those described above may be performed for providing a multi-patterning scheme, resulting in the cross-sectional depiction provided in FIG. 9C. FIG. 9C illustrates that after performing the a-C process, the portion of the dielectric layer 710 beneath the TS cut 310b and the TS cut 310c (FIG. 3) are preserved. Further, similar processes described below may be performed in the multi-patterned device of FIG. 9C.

Figure 10A:
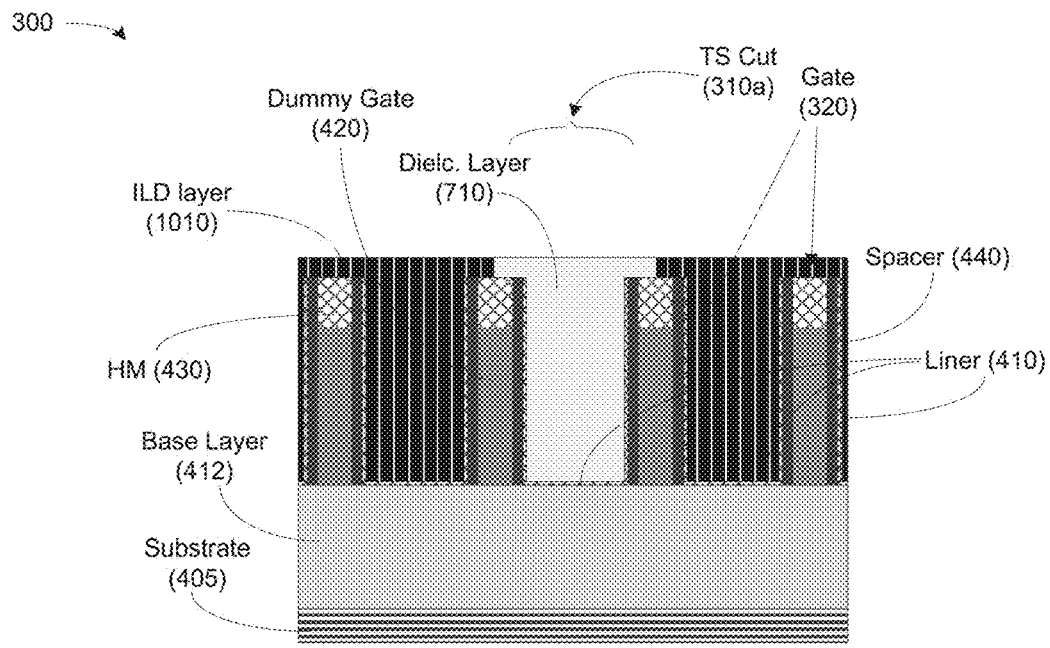
FIG. 10A illustrates a stylized cross-sectional view of the finFETs of FIG. 3 (along the X-cut line), regarding an ILD deposition and CMP process, in accordance with embodiments herein.
Figure 10B:
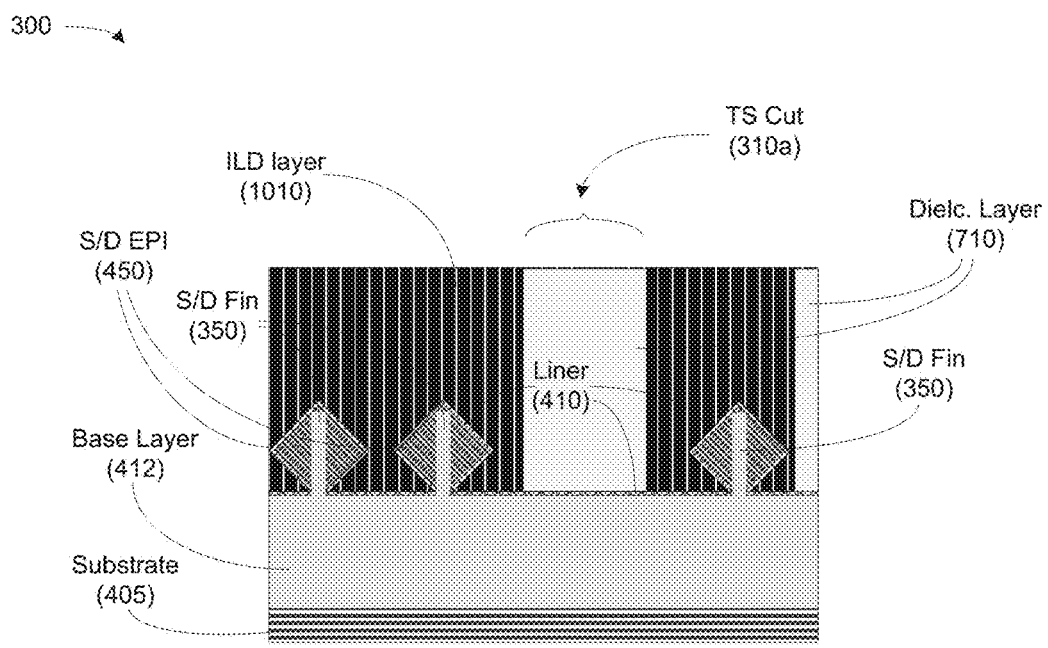
FIG. 10B illustrates a stylized cross-sectional view of the finFETs of FIG. 3 (along the Y-cut line) regarding the ILD deposition and CMP process, in accordance with embodiments herein.

Turning now to FIG. 10A, a stylized cross-sectional view of the finFETs of FIG. 3 (along the X-cut line), regarding an ILD deposition and CMP process, in accordance with embodiments herein, is provided. FIG. 10B provides a stylized cross-sectional view of the finFETs of FIG. 3 (along the Y-cut line) regarding the ILD deposition and CMP process, in accordance with embodiments herein. Referring simultaneously to FIGS. 10A and 10B, an interlayer dielectric (ILD) deposition process may be performed. The interlayer dielectric, e.g., $SiO_2$, may be deposited into areas that are not occupied by the remaining dielectric layer 710 (FIG. 9A, 9B, 9C) for forming an ILD layer 1010. That is, portions of the ILD layer 1010 are formed in substantially all regions except in the regions that are under the TS cuts 310*a-d*.

Accordingly, portions of the ILD layer 1010 are formed between gate regions 320 (FIG. 10A) and between the fins 330 (FIG. 10B), with the exception of regions under the TS cuts 310*a-d*. After the ILD layer 1010 is deposited, a chemical mechanical polishing process may be performed to bring the height of the ILD layer 1010 at about the height of the gate regions 320.

Figure 11A:
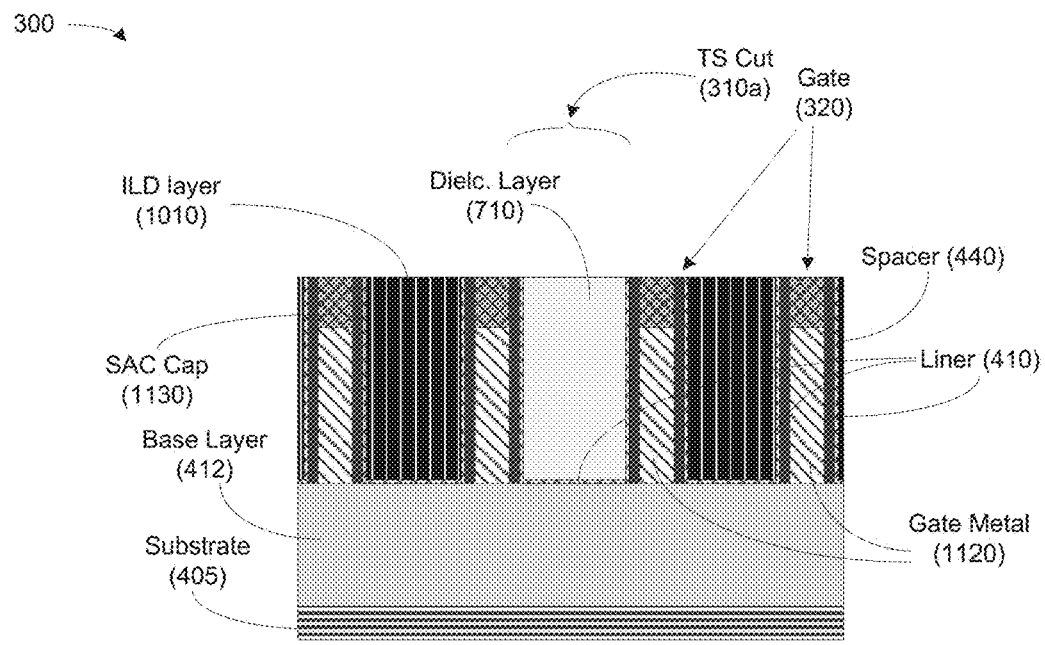
FIG. 11A illustrates a stylized cross-sectional view of the finFETs of FIG. 3 (along the X-cut line), illustrating an aftermath of an RMG and SAC cap process, in accordance with embodiments herein.
Figure 11B:
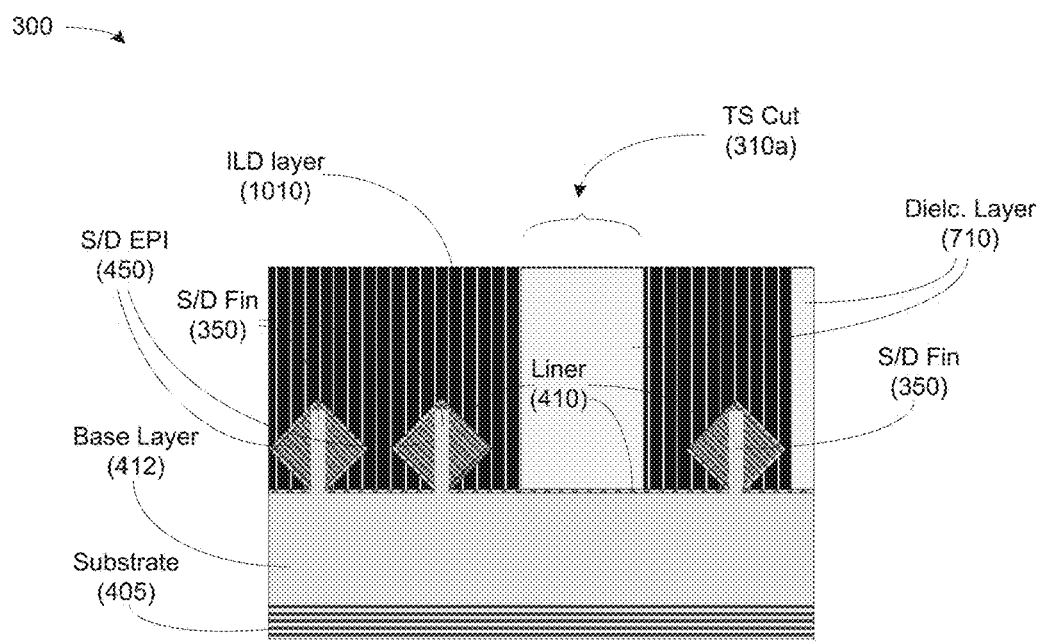
FIG. 11B illustrates a stylized cross-sectional view of the finFETs of FIG. 3 (along the Y-cut line) illustrating an aftermath of an RMG and SAC cap process, in accordance with embodiments herein.

Turning now to FIG. 11A, a stylized cross-sectional view of the finFETs of FIG. 3 (along the X-cut line), illustrating an aftermath of an RMG and SAC cap process, in accordance with embodiments herein, is provided. FIG. 11B provides a stylized cross-sectional view of the finFETs of FIG. 3 (along the Y-cut line) illustrating an aftermath of an RMG and SAC cap process, in accordance with embodiments herein.

Referring simultaneously to FIGS. 11A and 11B, a replacement metal gate (RMG) process may be performed. The RMG process may comprise performing various steps known to those skilled having benefit of the present disclosure. The RMG process may include removing the hard mask 430 and the dummy gates 420 (FIG. 4A, 4B). For example, the RMG process may comprise a dummy gate pull process for creating a plurality of voids for depositing gate metal. This process may include performing a poly open CMP (POC) process for exposing the dummy gate region 420. In some other embodiments, the POC process may be considered a separate step that is performed prior performing the RMG process. Further, an etch process (e.g., a poly-etch process) for removing the dummy gate material (e.g., poly-silicon material) from the dummy gate region 420 may be performed. The RMG process also includes depositing a gate metal 1120 in each of the gate features 320 in place of the dummy gates 420.

P-type and N-type work metal materials are respectively added to form NMOS and PMOS devices prior to deposition of a gate metal 1120. In some of the voids, N-type work function metal material (nWF) is deposited, while in other voids, P-type work function metal material (pWF) is deposited.

In some embodiments, the gate metal may be tungsten, while in other embodiments, the gate metal may be tungsten, or cobalt. Subsequently, a metal gate CMP process may be performed to polish the gate metal 1120 to a predetermined height.

Upon depositing the gate metal 1120, a self-aligned contact (SAC) cap formation process may be performed. SAC cap formation process may be comprised of recessing gate metal, deposition of a SAC cap dielectric material, and CMP of the SAC cap dielectric. This process results in a SAC cap 1130 formed above the gate metal 1120. In one embodiment, the SAC cap 1130 formed by depositing silicon nitride using low-pressure chemical vapor deposition (LPCVD) to a thickness of from about 15 nm to about 80 nm, e.g., about 40 nm. The cap layer 108 may be utilized as a mask during subsequent processes, such as a TS metallization process. The cap layer 108 may also be used as an etch barrier to prevent shorting between PC and S/D in next level contact, which lands on the TS metallization region.

Figure 12A:
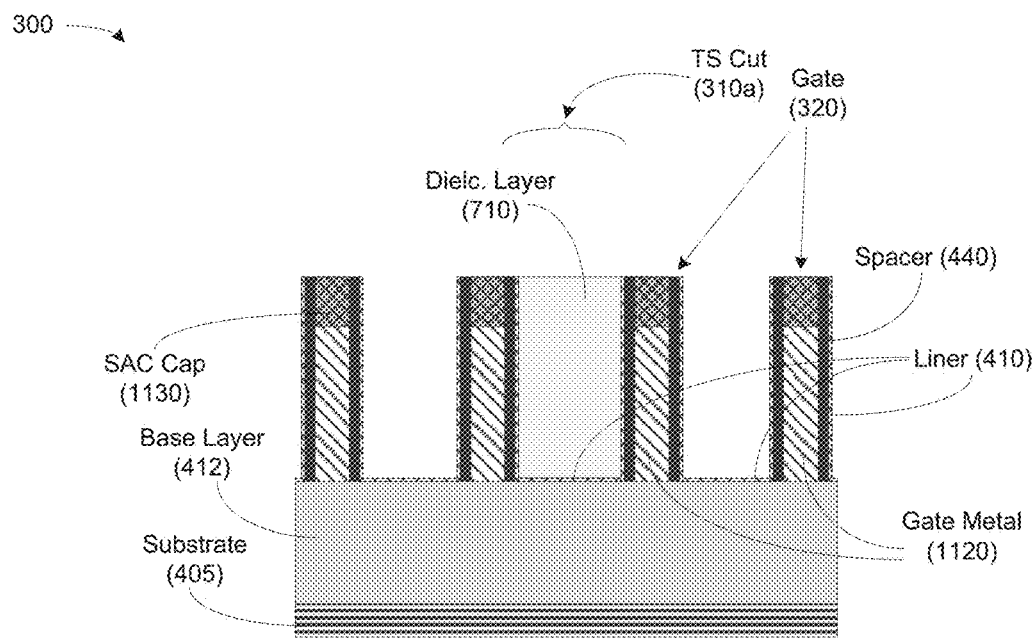
FIG. 12A illustrates a stylized cross-sectional view of the finFETs of FIG. 3 (along the X-cut line), illustrating an aftermath of an ILD removal process, in accordance with embodiments herein.
Figure 12B:
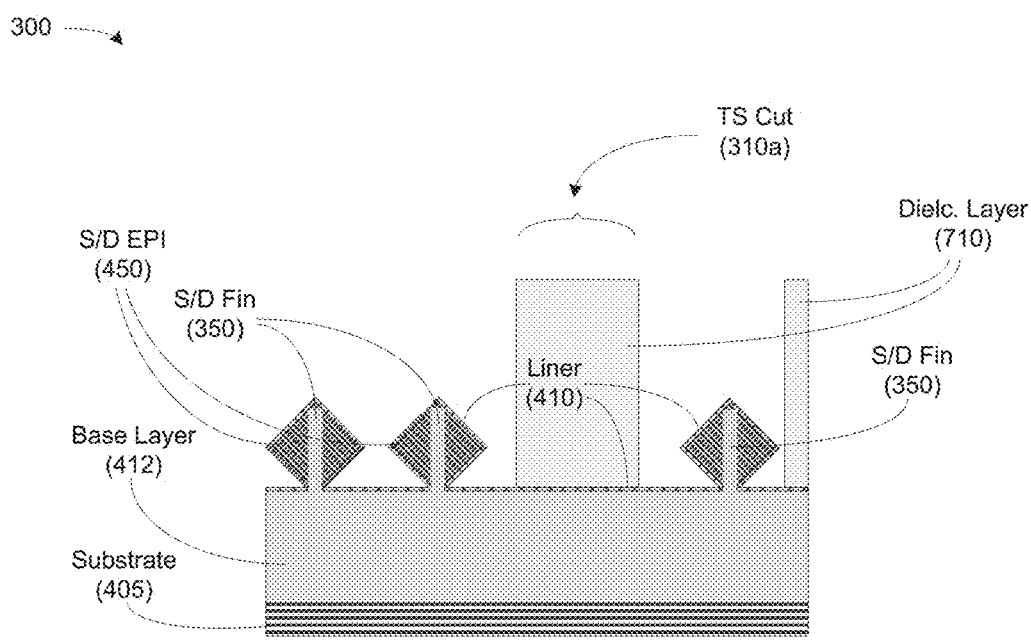
FIG. 12B illustrates a stylized cross-sectional view of the finFETs of FIG. 3 (along the Y-cut line) illustrating an aftermath of the ILD removal process, in accordance with embodiments herein.

Turning now to FIG. 12A, a stylized cross-sectional view of the finFETs of FIG. 3 (along the X-cut line), illustrating an aftermath of an ILD removal process, in accordance with embodiments herein, is provided. FIG. 12B provides a stylized cross-sectional view of the finFETs of FIG. 3 (along the Y-cut line) illustrating an aftermath of the ILD removal process, in accordance with embodiments herein.

Referring simultaneously to FIGS. 12A and 12B, a selective etch process may be performed to selectively remove the ILD layer 1010. In one embodiment, a wet etch may be performed to selectively remove the ILD layer 1010 (e.g., $SiO_2$ layer), preserving the dielectric material 710 (e.g., SiN) under the TS cut regions (310*a-d*). Therefore, portions of the dielectric material 710 remain between the gate features 320 within the TS cut regions 310*a-d* (FIG. 12A), and between the fins 330 in the TS cut regions 310-*d*.

Figure 13A:
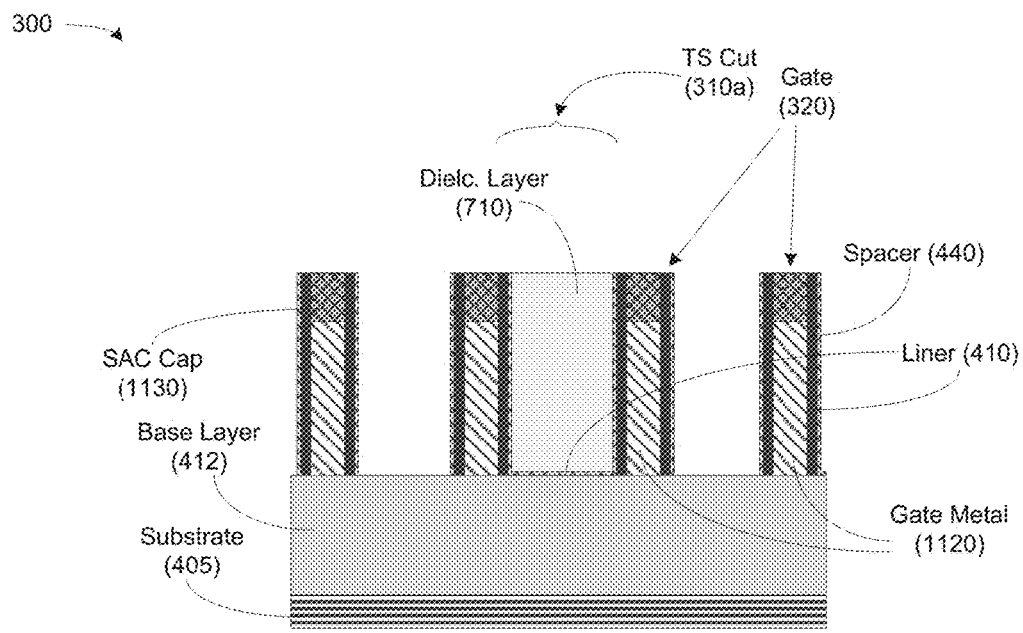
FIG. 13A illustrates a stylized cross-sectional view of the finFETs of FIG. 3 (along the X-cut line), illustrating an aftermath of an EPI liner break-through process, in accordance with embodiments herein.
Figure 13B:
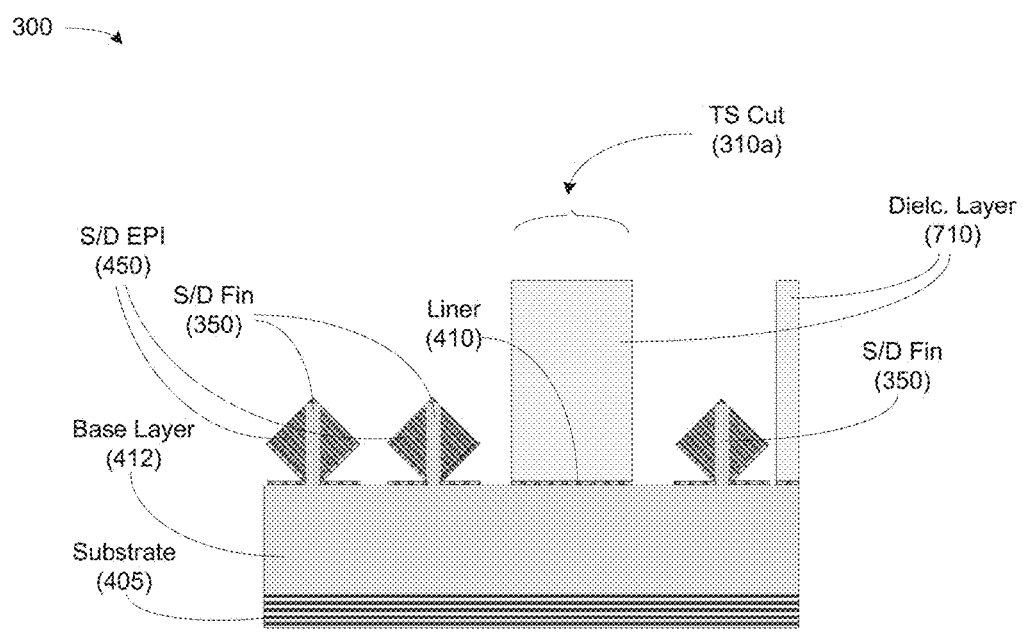
FIG. 13B illustrates a stylized cross-sectional view of the finFETs of FIG. 3 (along the Y-cut line) illustrating an aftermath of the EPI liner break-through process, in accordance with embodiments herein.

Turning now to FIG. 13A, a stylized cross-sectional view of the finFETs of FIG. 3 (along the X-cut line), illustrating an aftermath of an EPI liner break-through process, in accordance with embodiments herein, is provided. FIG. 13B provides a stylized cross-sectional view of the finFETs of FIG. 3 (along the Y-cut line) illustrating an aftermath of the EPI liner break-through process, in accordance with embodiments herein.

Referring simultaneously to FIGS. 13A and 13B, an EPI liner break-through process comprising performing an etch process to selectively remove the liner 410, is performed. As shown in FIG. 13A, the liner 410 is removed from horizontal areas of the device 300. Thin layers of the liner 410 remain on the side walls of the gate formations 320.

As shown in FIG. 13B, with regard to the fins 320, the liner 410 is removed from the top portions of the EPI features 430, as well as from the horizontal areas that are not covered by the EPI features 430. Therefore, some portions of the liner 410 remain on portions of the base layer 412 that are below the EPI features 430, as shown in FIG. 13B.

Figure 14A:
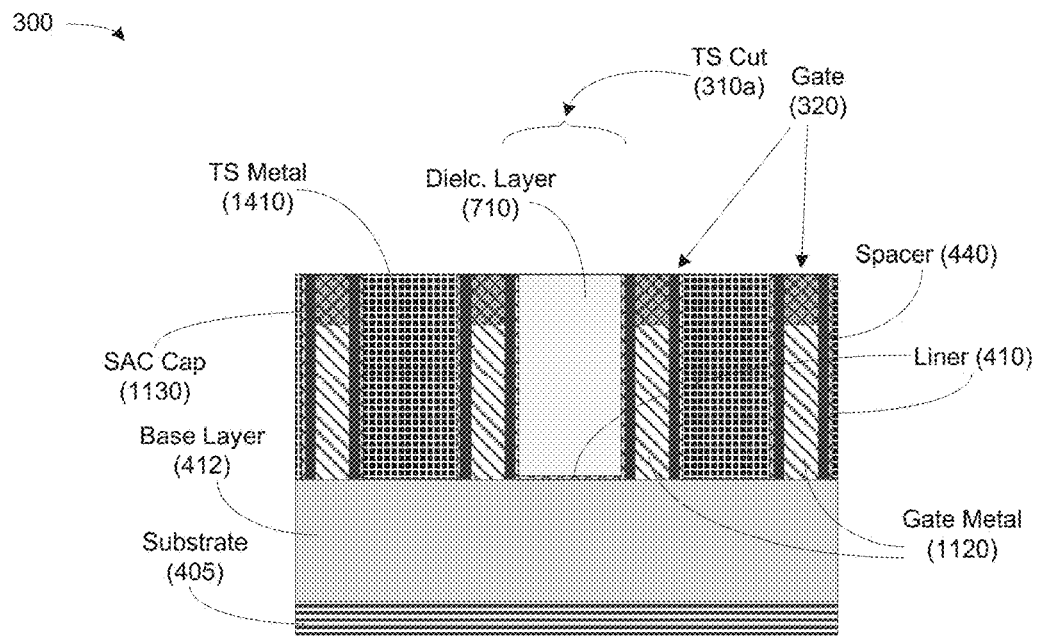
FIG. 14A illustrates a stylized cross-sectional view of the finFETs of FIG. 3 (along the X-cut line), illustrating an aftermath of a TS metallization process and a CMP process, in accordance with embodiments herein.
Figure 14B:
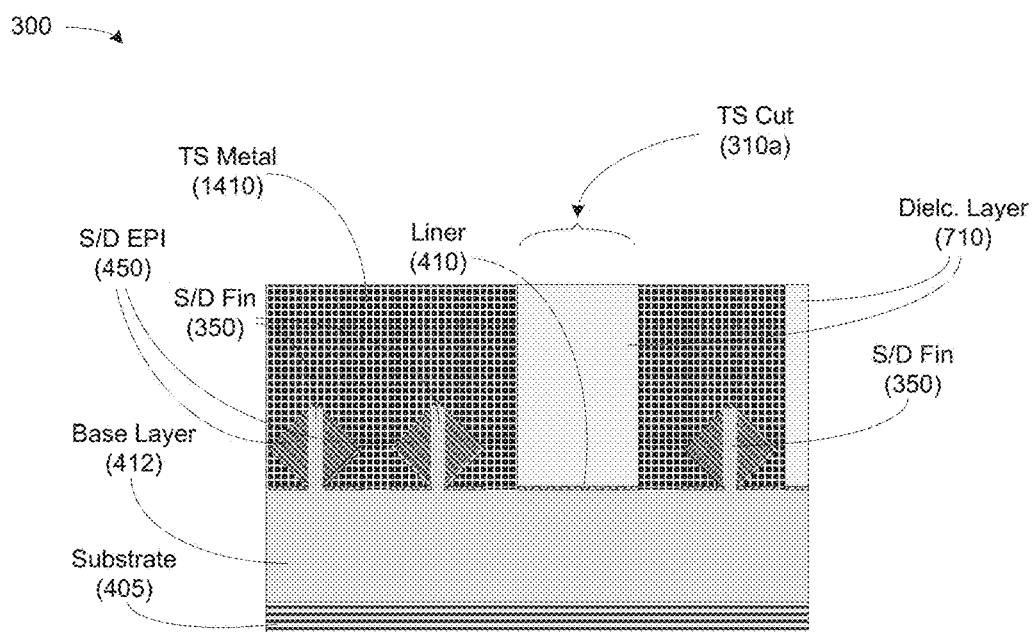
FIG. 14B illustrates a stylized cross-sectional view of the finFETs of FIG. 3 (along the Y-cut line) illustrating the aftermath of a TS metallization process and a CMP process, in accordance with embodiments herein.

Turning now to FIG. 14A, a stylized cross-sectional view of the finFETs of FIG. 3 (along the X-cut line), illustrating an aftermath of a TS metallization process and a CMP process, in accordance with embodiments herein, is provided. FIG. 14B provides a stylized cross-sectional view of the finFETs of FIG. 3 (along the Y-cut line) illustrating the aftermath of a TS metallization process and a CMP process, in accordance with embodiments herein.

Referring simultaneously to FIGS. 14A and 14B, a metal deposition process may be performed for depositing metal in regions outside the TS cuts 310*a-d* to form TS metal layers 1410. The TS metal layers 1410 may comprise tungsten, cobalt, or the like. Generally, in order to form the TS metal layers 1410, a metal material is deposited into the voids of FIGS. 13A, 13B that are not occupied by the dielectric metal 710 as shown in FIGS. 14A, 14B.

Subsequently, a CMP process may be performed to polish down the TS metal layer 1410 to a predetermined height, e.g., the height of the gate formations 320. After performing the TS metallization and CMP processes, subsequent processing known to those skilled in the art having benefit of the present disclosure, are performed to complete forming the device 300.

Figure 15:
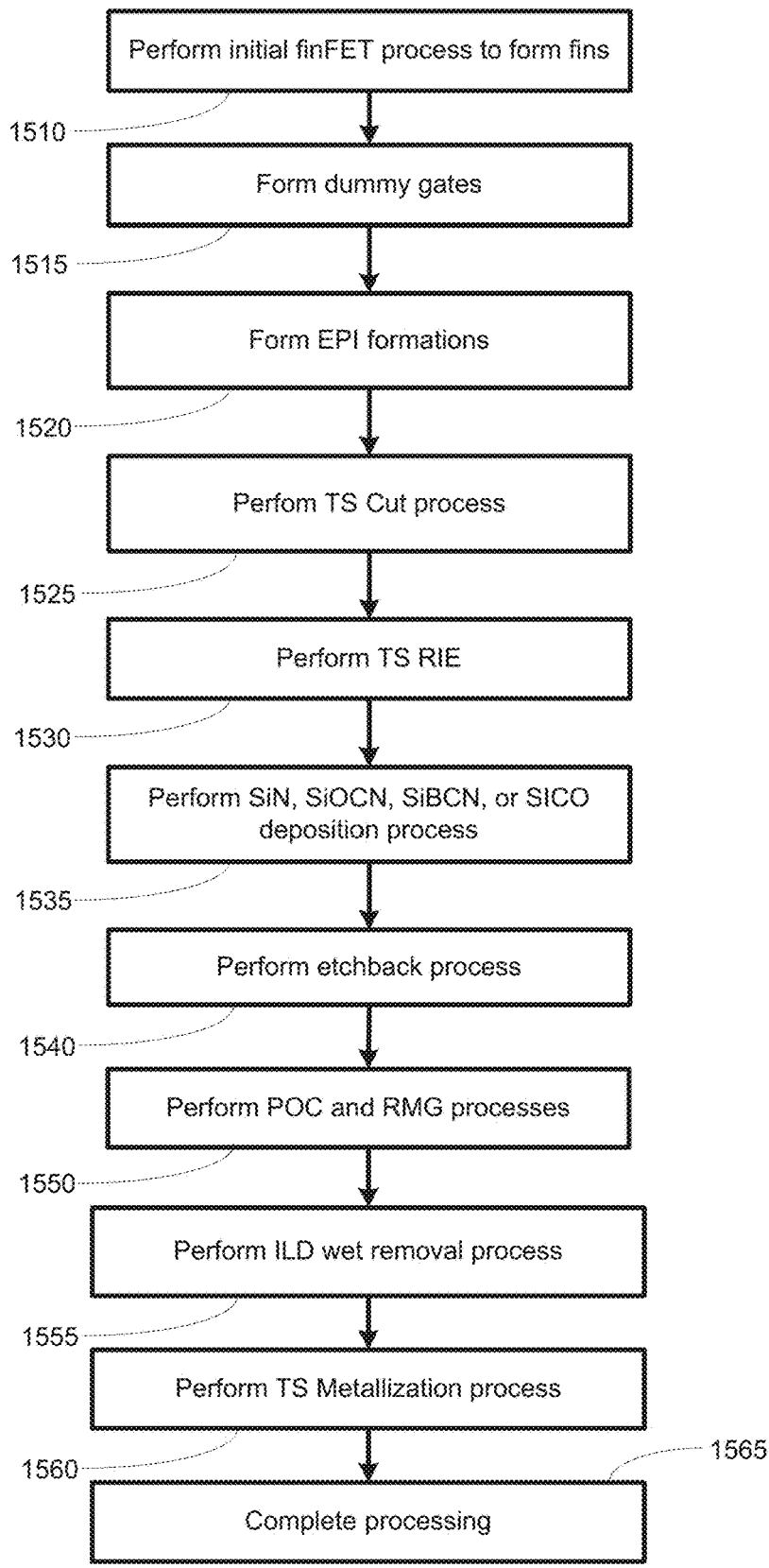
FIG. 15 illustrates a flowchart depiction of the process for forming TS features, in accordance with embodiments herein.

Turning now to FIG. 15, a flowchart depiction of the process for forming TS features, in accordance with embodiments herein, is illustrated. A determination may be made as to the device type of a finFET device, i.e., P-type device or N-type device and initial finFET processes to form fins for the finFET devices are performed (at 1510). Subsequently, dummy gate formations may be formed (at 1515), see e.g., FIG. 4A. Further, EPI features may be formed on the fins (at 1520), see e.g., FIG. 4B.

Subsequently, a TS cut process may be performed (at 1525), followed by a TS RIE process (at 1530). These processes generally involve various process steps known to those skilled in the art having benefit of the present disclosure. For example, an a-C layer deposition process, followed by a PR layer deposition process may be performed in regions that are not designated as TS cut regions (or non-TS regions), see e.g., FIGS. 5A, 5B. Further, etching processes, such as RIE, SiN (or SiOCN, SiBCN, or SiCO) etchback process, a-C ashing process, etc. may be performed, see e.g., FIGS. 6A-7B.

An SiN (or SiOCN, SiBCN, or SiCO) deposition process may be performed (at 1535). This process may be performed using an atomic layer deposition (ALD) process, see e.g., FIGS. 7A, 7B. The processes described in FIG. 15 may be also performed under the context of multi-patterning processes, employing memorization schemes (see e.g., FIG. 9C). An etchback process may then be performed to bring dielectric layers to a predetermined level (at 1540).

Subsequently, POC and RGM processes may be performed (at 1550), as described above, (see e.g., FIGS. 11a, 11b). The dummy gate regions of the gate features may be replaced with a metal, e.g., tungsten, cobalt, etc.

An ILD etch process may be performed to selectively etch the ILD layer (at 1555). After performing an ILD wet removal process, a TS metallization process may be performed (at 1560). Subsequently, additional processes may be performed for completing processing and fabricating predetermined integrated circuit devices (at 1565). The process scheme described in FIG. 15 may provide for reducing or eliminating the need for an early oxide deposition process, thereby avoiding the need to perform etching of oxide and/or nitride materials for forming TS features. Other advantages may include saving at least one CMP step, a reduction in gate shorting probably, and/or provides a simpler process flow, leading to more efficient processing of semiconductor devices.

Figure 16:
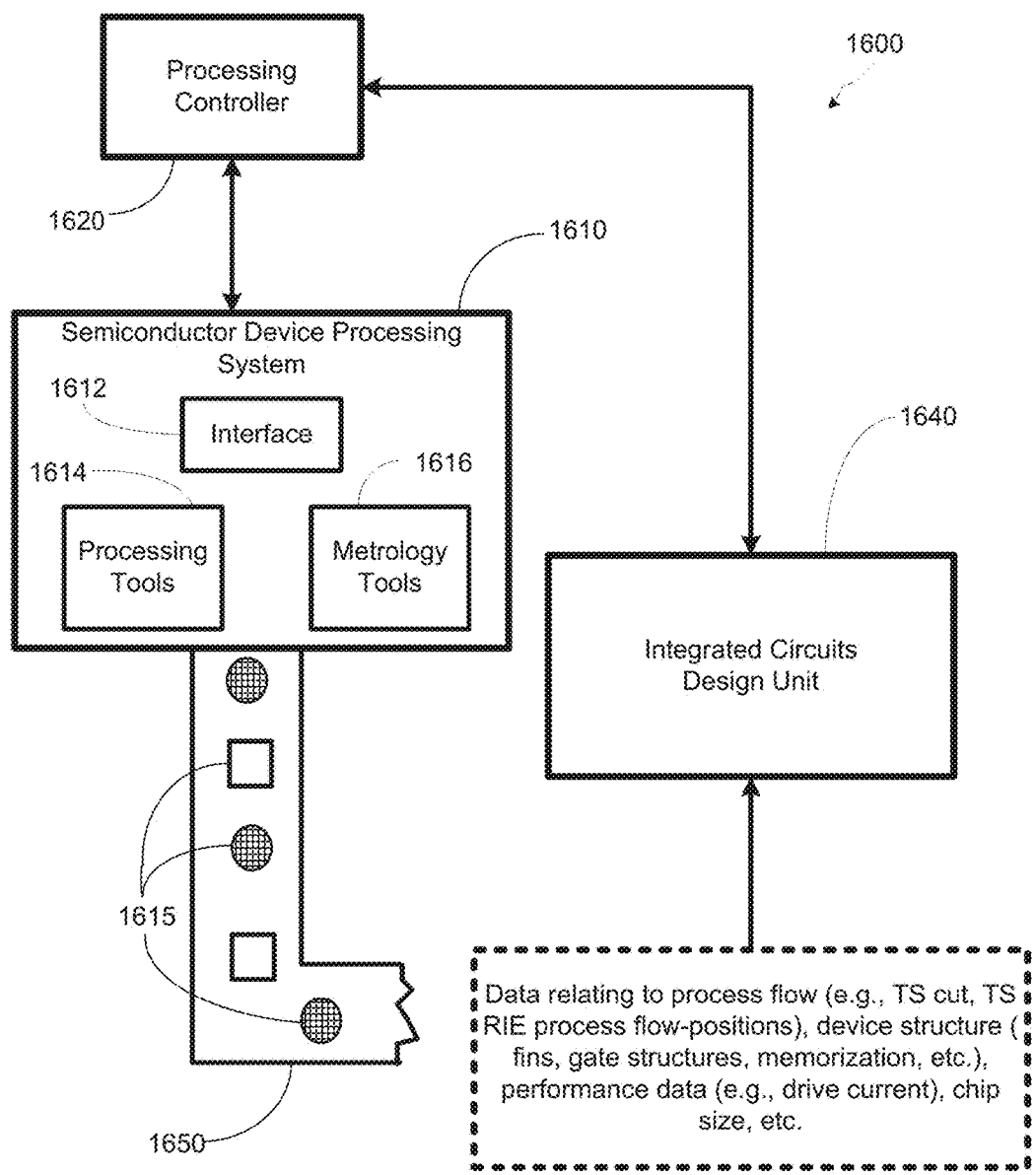
FIG. 16 illustrates a stylized depiction of a system for fabricating a semiconductor device comprising an integrated circuit, in accordance with embodiments herein.

Turning now to FIG. 16, a stylized depiction of a system for fabricating a semiconductor device comprising an integrated circuit, in accordance with embodiments herein, is illustrated. The system 1600 provides for performing an early TS cut process for providing various benefits/advantages described herein. The system 1600 of FIG. 16 may comprise a semiconductor device processing system 1610 and a design unit 1640. The semiconductor device processing system 1610 may manufacture integrated circuit devices based upon one or more designs provided by the design unit 1640.

The semiconductor device processing system 1610 may comprise various processing stations, such as etch process stations, photolithography process stations, CMP process stations, etc. One or more of the processing steps performed by the processing system 1610 may be controlled by the processing controller 1620. The processing controller 1620 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1610 may produce integrated circuits on a medium, such as silicon wafers. More particularly, the semiconductor device processing system 1610 produce integrated circuits having finFET devices that comprise fins that have channel voids filled with oxide and performed in a manner to reduce or substantially prevent oxidization, as described above.

The production of integrated circuits by the device processing system 1610 may be based upon the circuit designs provided by the integrated circuits design unit 1640. The processing system 1610 may provide processed integrated circuits/devices 1615 on a transport mechanism 1650, such as a conveyor system. In some embodiments, the conveyor system may be sophisticated clean room transport systems that are capable of transporting semiconductor wafers. In one embodiment, the semiconductor device processing system 1610 may comprise a plurality of processing steps to perform an early TS cut process for providing a more efficient process for forming TS features, as described above.

In some embodiments, the items labeled "1615" may represent individual wafers, and in other embodiments, the items 1615 may represent a group of semiconductor wafers, e.g., a "lot" of semiconductor wafers. The integrated circuit or device 1615 may be a transistor, a capacitor, a resistor, a memory cell, a processor, and/or the like.

The integrated circuit design unit 1640 of the system 1600 is capable of providing a circuit design that may be manufactured by the semiconductor processing system 1610. The integrated circuit design unit 1640 may be capable of determining the number of devices (e.g., processors, memory devices, etc.) to place in a device package. The integrated circuit design unit 1640 may also determine the height of the fins, the size of the fin channels, etc. These dimensions may be based upon data relating to drive currents/performance metrics, device dimensions, threshold voltages, etc. Based upon such details of the devices, the integrated circuit design unit 1640 may determine specifications of the finFETs that are to be manufactured. Based upon these specifications, the integrated circuit design unit 1640 may provide data for manufacturing a semiconductor device package described herein. This specification may include processing semiconductor wafer such that TS cut layer is performed relatively early in the processing scheme.

The system 1600 may be capable of performing analysis and manufacturing of various products involving various technologies. For example, the system 1600 may design and production data for manufacturing devices of CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   forming a gate structure, a source structure, and a drain structure of a transistor, wherein said gate structure comprises a dummy gate region, a gate spacer, and a liner;
   performing a source/drain (S/D) contact cut process comprised of performing a TS etch process for forming a non-TS trench;
   depositing a dielectric layer into said non-TS trench;

performing a S/D contact etch process;
performing a replacement metal gate (RMG) process subsequent to performing said S/D contact etch process; and
performing an S/D contact metallization process.

2. The method of claim 1, wherein performing said S/D contact cut process comprises performing a trench silicide (TS) cut process comprising:
determining a non-TS location of said transistor; and
forming a non-TS lithography stack.

3. The method of claim 2, wherein forming said non-TS lithography stack comprises:
forming an amorphous-carbon (a-C) layer;
forming an anti-reflective coat (ARC) layer over said a-C layer; and
forming a photoresist layer above said a-C layer, wherein said photoresist layer is formed only in regions outside said non-TS location.

4. The method of claim 3, wherein performing said TS etch process for forming a non-TS trench comprises performing a reactive ion etch (RIE) process for removing a portion of said a-C layer and a portion of said ARC layer in the non-TS location.

5. The method of claim 1, wherein depositing a dielectric layer into said non-TS trench, further comprises depositing at least one of a SiN material, a SiCO material, a SiOCN material, or a SiBCN material.

6. The method of claim 1, wherein performing said RMG process comprises:
performing a poly open CMP (POC) process for exposing said dummy gate region;
performing a poly-etch process for removing a polysilicon material from said dummy gate region, thereby creating a first void in place of said dummy gate region;
depositing a gate metal into said first void; and
performing a metal gate CMP process for polishing said gate metal to a predetermined height.

7. The method of claim 6, further comprising:
depositing an inter-layer dielectric (ILD) material outside said non-TS location prior to performing said RMG process;
performing an ILD removal process for removing said ILD material outside said non-TS location, thereby creating a second void between a plurality of gate features outside said non-TS location; and
removing said liner from horizontal areas and over a first EPI formation of said source structure and a second EPI formation of said drain structure.

8. The method of claim 6, further comprising:
recessing said a gate metal to depth ranging from about 10 nm to 60 nm, for forming a second void in place of said dummy gate region;
depositing a SiN dielectric material in said second void;
performing a SiN CMP process for polishing said SiN dielectric material to expose a SiO2 dielectric material to form a self-aligned contact (SAC) cap.

9. The method of claim 1, wherein performing an S/D contact metallization process comprises depositing a metal material into regions outside said non-TS location between a plurality of gate structures.

10. The method of claim 1, further comprising performing a chemical mechanical polishing process to substantially remove the dielectric layer located outside said non-TS trench.

11. A method, comprising:
forming a plurality of gate structures, a plurality of source structures, and a plurality of drain structures of a transistor, wherein each of said gate structures comprises a dummy gate region, a gate spacer, and a liner;
determining a non-TS region of said transistor;
forming a non-TS lithography stack outside said non-TS region;
performing a TS etch process subsequent to forming said non-TS lithography stack for forming a non-TS trench between at least a portion of said plurality of gate structures;
performing a replacement metal gate (RMG) process subsequent to performing said TS etch process; and
performing a TS metallization process outside said non-TS location by depositing a metal material into regions outside said non-TS location between at least a portion of said gate structures.

12. The method of claim 11, wherein performing said non-TS lithography stack comprises:
forming an amorphous-carbon (a-C) layer;
forming an anti-reflective coat (ARC) layer over said a-C layer; and
forming a photoresist layer above said a-C layer, wherein said photoresist layer is formed only in regions outside said non-TS location.

13. (Original) The method of claim 11, wherein performing said TS etch process comprises performing a reactive ion etch (RIE) process for removing a portion of said a-C layer and a portion of said ARC layer in the non-TS location.

14. The method of claim 11, further comprising:
depositing a dielectric layer into said non-TS trench, wherein said dielectric layer comprises at least one of a SiN material or a SiCO material;
depositing an inter-layer dielectric (ILD) material outside said non-TS location prior to performing said RMG process;
performing an ILD removal process for removing said ILD material outside said non-TS location creating a plurality of voids between a plurality of gate features outside said non-TS location; and
removing said liner from horizontal areas and over an EPI formation of said source and drain structures; and
wherein performing a TS metallization process comprises depositing a metal material into said voids.

15. A system, comprising:
a semiconductor device processing system to manufacture a semiconductor device comprising at least one fin field effect transistor (finFET); and
a processing controller operatively coupled to said semiconductor device processing system, said processing controller configured to control an operation of said semiconductor device processing system;
wherein said semiconductor device processing system is adapted to:
form a gate structure, a source structure, and a drain structure of a transistor, wherein said gate structure comprising a dummy gate region, a gate spacer, and a liner;
perform a source/drain (S/D) contact cut process comprised of performing a TS etch process for forming a non-TS trench;
deposit a dielectric layer into said non-TS trench;
perform a S/D contact etch process;
perform a replacement metal gate (RMG) process subsequent to performing said S/D contact etch process; and
perform an S/D contact metallization process.

16. The system of claim 15, further comprising a design unit configured to generate a first design comprising a definition for a process mask and a definition for forming a transistor, wherein data from said design unit is used by said processing controller to control an operation of said semiconductor device processing system.

17. The system of claim 15, wherein to perform said source/drain (S/D) contact cut process, said semiconductor device processing system further adapted to:
   determine a non-TS location of said transistor; and
   form a non-TS lithography stack.

18. The system of claim 17, wherein to form said non-TS lithography stack, said semiconductor device processing system further adapted to:
   form an amorphous-carbon (a-C) layer;
   form an anti-reflective coat (ARC) layer over said a-C layer; and
   form a photoresist layer above said a-C layer, wherein said photoresist layer is formed only in regions outside said non-TS location.

19. The system of claim 15, wherein said semiconductor device processing system further adapted to perform the TS etch process for forming the non-TS trench further comprises performing a reactive ion etch (RIE) process for removing a portion of said a-C layer and a portion of said ARC layer in the non-TS location.

20. The system of claim 15, wherein said semiconductor device processing system further adapted to:
   deposit an inter-layer dielectric (ILD) material outside said non-TS location prior to performing said RMG process;
   perform ILD removal process for removing said ILD material outside said non-TS location creating a void between a plurality of gate features outside said non-TS location;
   remove said liner from horizontal areas and over an EPI formation of said source and drain structures; and
   perform a self-aligned contact (SAC) cap deposition process to form a cap over said gate metal.

* * * * *